(12) United States Patent
Kang et al.

(10) Patent No.: US 7,689,741 B2
(45) Date of Patent: Mar. 30, 2010

(54) DUAL BUFFER MEMORY SYSTEM FOR REDUCING DATA TRANSMISSION TIME AND CONTROL METHOD THEREOF

(75) Inventors: Eun-Suk Kang, Gyeonggi-do (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 776 days.

(21) Appl. No.: 10/940,038

(22) Filed: Sep. 13, 2004

(65) Prior Publication Data

US 2005/0060486 A1 Mar. 17, 2005

(30) Foreign Application Priority Data

Sep. 16, 2003 (KR) .................. 10-2003-0064210

(51) Int. Cl.
*G06F 3/00* (2006.01)
*G06F 12/00* (2006.01)

(52) U.S. Cl. ..................... 710/56; 711/103
(58) Field of Classification Search ............. 710/56; 365/185

See application file for complete search history.

(56) References Cited

U.S. PATENT DOCUMENTS

| | | | | | |
|---|---|---|---|---|---|
| 5,822,245 | A * | 10/1998 | Gupta et al. | ........... | 365/185.12 |
| 5,822,251 | A * | 10/1998 | Bruce et al. | ........... | 365/185.33 |
| 5,982,672 | A * | 11/1999 | Moon et al. | ........... | 365/189.02 |
| 6,307,565 | B1 * | 10/2001 | Quirk et al. | ................. | 345/554 |
| 6,421,274 | B1 * | 7/2002 | Yoshimura | ............. | 365/185.12 |
| 6,421,770 | B1 * | 7/2002 | Huch et al. | ................. | 711/209 |
| 6,636,690 | B1 * | 10/2003 | Fukushima et al. | ........... | 386/94 |
| 2002/0124129 | A1 * | 9/2002 | Zilberman | ................. | 711/103 |

\* cited by examiner

*Primary Examiner*—Henry W. H. Tsai
*Assistant Examiner*—Titus Wong
(74) *Attorney, Agent, or Firm*—Volentine & Whitt, PLLC

(57) ABSTRACT

A dual buffer memory system capable of improving system performance by reducing a data transmission time and a control method thereof are provided. The dual buffer memory system includes a flash memory block and a plurality of buffers. The dual buffer memory system uses a dual buffering scheme in which one buffer among the plurality of buffers interacts with the flash memory block and simultaneously a different buffer among the plurality of buffers interacts with a host. Therefore, it is possible to reduce a data transmission time between the flash memory and the host, thereby improving system performance.

12 Claims, 11 Drawing Sheets

DUAL BUFFER MEMORY SYSTEM FOR REDUCING DATA TRANSMISSION TIME AND CONTROL METHOD THEREOF

This application claims the priority of Korean Patent Application No. 2003-64210, filed on Sep. 16, 2003, in the Korean Intellectual Property Office, the disclosure of which is incorporated herein in its entirety by reference.

BACKGROUND OF THE INVENTION

1. Field of the Invention

The present invention relates to a memory system, and more particularly, to a dual buffer memory system and a control method thereof.

2. Description of the Related Art

Along with development of mobile systems and various application systems, demands for a flash memory, which is a nonvolatile memory, and a memory system for controlling the flash memory are increasing. A memory system for controlling a flash memory includes a flash memory, a control circuit, and a buffer for temporarily storing data. Parameters which affect system performance in the memory system are specific write and read times of a flash memory, a data transmission time between the flash memory and a buffer, a data transmission time between the buffer and a host, etc.

However, since the specific write and read times of the flash memory are limited, the data transmission time between the flash memory and buffer and the data transmission time between the buffer and host must be reduced in order to improve the performance of a memory system. To reduce such data transmission times, a method which increases the widths of data buses or a method which increases operating frequencies of the flash memory and buffers can be used. However, these methods significantly increase chip areas of the flash memory and buffers, or there is a difficulty in applying these methods to a practical device due to a limitation of the manufacturing process.

When data is written to a flash memory in a memory system including one buffer, a host loads data in the buffer, the buffer loads the loaded data into the flash memory, the flash memory records the received data therein, and after a predetermined time has elapsed, the host again loads data in the buffer. Due to such operations, the data transmission time is long when data corresponding to a multiple of the capacity of the buffer is written to the flash memory, which deteriorates the system performance.

Embodiments of the invention address these and other limitations of the prior art.

SUMMARY OF THE INVENTION

Embodiments of the invention provide a dual buffer memory system capable of improving system performance by reducing data transmission time, as well as a method of controlling the dual buffer memory system.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings.

The same reference numbers refer to the same components throughout the drawings.

Figure 1:
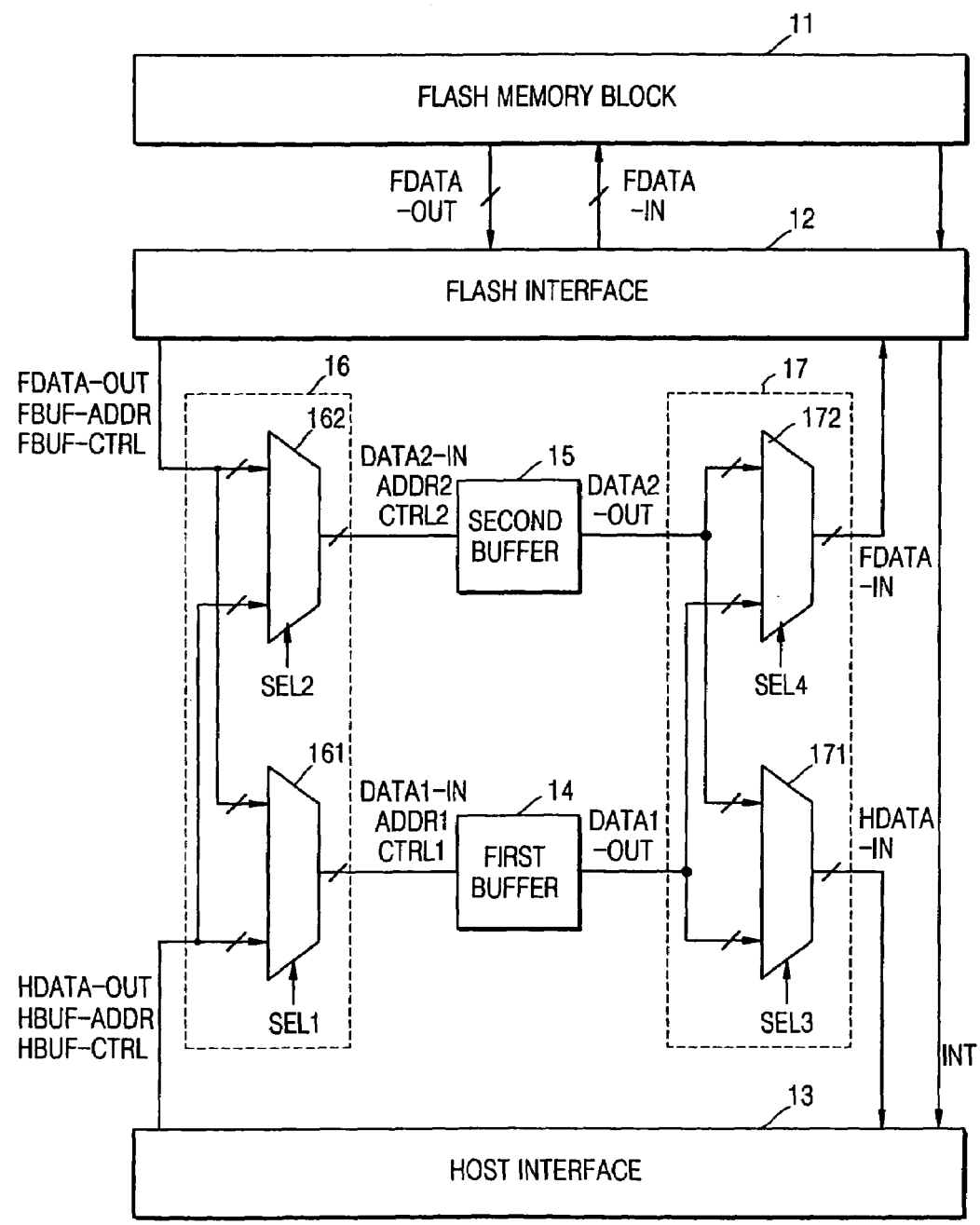
FIG. 1 is a block diagram of a dual buffer memory system according to an embodiment of the invention.

FIG. 1 is a block diagram of a dual buffer memory system according to an embodiment of the invention. Referring to FIG. 1, the dual buffer memory system includes a flash memory block 11, a flash interface 12, a host interface 13, a first buffer 14, a second buffer 15, a first control circuit 16 and a second control circuit 17.

The flash memory block 11 stores data and includes flash memory cells. The flash interface 12 performs interfacing with the flash memory block 11. The flash memory block 11 and the flash interface 12 are well-known in the art, and therefore the detailed descriptions thereof are omitted.

The host interface 13 performs interfacing with external hosts. The first buffer 14 and the second buffer 15 temporarily store data read from the flash memory block 11 or data received from hosts. The first and second buffers 14 and 15 may be RAMs.

The first control circuit 16 selects one of the first and second buffers 14 and 15, receives data FDATA-OUT read from the flash memory block 11, a first address FBUF-ADDR, and first control signals FBUF-CTRL through the flash interface 12, or receives input data HDATA-OUT, a second address HBUF-ADDR, and second control signals HBUF-CTRL provided from the host through the host interface 13, and outputs them to the selected buffer.

The second control circuit 17 receives data DATA1-OUT output from the first buffer 14 or data DATA2-OUT output from the second buffer 15, and outputs the received data to the flash memory block 11 through the flash interface 12 or to the host through the host interface 13.

The first buffer 14 and the second buffer 15 are selected by the first address FBUF-ADDR or the second address HBUF-ADDR. While any one of the first and second buffers 14 and 15 interacts with the flash memory 11, simultaneously, the other one of the first and second buffers 14 and 15 can interact with the host.

In other words, the memory system of FIG. 1 according to embodiments of the invention uses a dual buffering scheme using two buffers in order to reduce the data transmission time. According to the dual buffering scheme, one buffer interacts with a flash memory and simultaneously the other buffer interacts with a host in a memory system including at least two buffers. A dual buffering method of the memory system according to embodiments of the invention will be described later with reference to FIGS. 2 through 5.

The flash interface 12 generates a flag signal INT indicating whether or not the flash memory block 11 interacts with the first buffer 14 or the second buffer 15, and outputs the flag signal INT to the host through the host interface 13. The flash memory block 11, the flash interface 12, the host interface 13, the first buffer 14, the second buffer 15, the first control circuit 16, and the second control circuit 17 are preferably integrated on one chip.

Describing in more detail, the first control circuit 16 includes a first input selection circuit 161 and a second input selection circuit 162. The first input selection circuit 161 outputs the read data FDATA-OUT, the first address FBUF-ADDR, and the first control signals FBUF-CTRL received from the flash interface 12 to the first buffer 14, or outputs the input data HDATA-OUT, the second address HBUF-ADDR, and the second control signals HBUF-CTRL received from the host interface 13 to the first buffer 14, in response to a first selection signal SEL1.

When the host and the memory block 11 try to occupy the first buffer 14 at the same time, the first input selection circuit 161 blocks data, addresses, and control signals received from the one with a lower priority among the host and the flash memory block. In other words, if the host and the flash memory block 11 try to occupy the first buffer 14 at the same time and the flash memory block 11 has a priority lower than the host, the first selection signal SEL1 is changed to a first logic level, for example, to a logic "high" state. Accordingly, the first input selection circuit 161 blocks the read data FDATA-OUT, the first address FBUF-ADDR, and the first control signals FBUF-CTRL received from the flash interface 12, and instead outputs the input data HDATA-OUT, the second address HBUF-ADDR, and the second control signals HBUF-CTRL received from the host interface 13 to the first buffer 14.

On the contrary, if the host has a priority lower than the flash memory block 11, the first selection signal SEL1 is changed to a second logic level, for example, to a logic "low" state. Accordingly, the first input selection circuit 161 blocks the input data HDATA-OUT, the second address HBUF-ADDR, and the second control signals HBUF-CTRL received from the host interface 13, and instead outputs the read data FDATA-OUT, the first address FBUF-ADDR, and the first control signals FBUF-CTRL received from the flash interface 12 to the first buffer 14.

The second input selection circuit 162 outputs the read data FDATA-OUT, the first address FBUF-ADDR, and the first control signals FBUF-CTRL received from the flash interface 12 to the second buffer 15, or outputs the input data HDATA-OUT, the second address HBUF-ADDR, and the second control signals HBUF-CTRL received from the host interface 13 to the second buffer 15, in response to a second selection signal SEL2.

When the host and the flash memory block 11 try to occupy the second buffer 15 at the same time, the second input selection circuit 162 blocks data, addresses, and control signals received from the one with a lower priority among the host and the flash memory block. In other words, if the host and the flash memory block 11 try to occupy the second buffer 15 at the same time and the flash memory block 11 has a priority lower than the host, the second selection signal SEL2 is changed to a first logic level, for example, to a logic "high" state. Accordingly, the second input selection circuit 162 blocks the read data FDATA-OUT, the first address FBUF-ADDR, and the first control signals FBUF-CTRL received from the flash interface 12, and instead outputs the input data HDATA-OUT, the second address HBUF-ADDR, and the second control signals HBUF-CTRL received from the host interface 13 to the second buffer 15.

If the host has a priority lower than the flash memory block 11, the second selection signal SEL2 is changed to a second logic level, for example, to a logic "low" state, so that the second input selection circuit 162 blocks the input data HDATA-OUT, the second address HBUF-ADDR, and the second control signals HBUF-CTRL received from the host interface 13 and instead outputs the read data FDATA-OUT, the first address FBUF-ADDR, and the first control signals FBUF-CTRL received from the flash interface 12 to the second buffer 15.

The second control circuit 17 includes a first output selection circuit 171 and a second output selection circuit 172. The first output selection circuit 171 receives data DATA1-OUT output from the first buffer 14 or data DATA2-OUT output from the second buffer 15 and outputs them to the host through the host interface 13, in response to a third selection signals SEL3.

If the third selection signal SEL3 is changed to the first logic level, for example, to the logic "high" state, the first output selection circuit 171 blocks the data DATA1-OUT output from the first buffer 14, receives the data DATA2-OUT output from the second buffer 15 and outputs the data DATA2-OUT to the host through the host interface 13. If the third selection signal SEL3 is changed to the second logic level, for example, to the logic "low" state, the first output selection circuit 171 blocks the data DATA2-OUT output from the second buffer 15, receives the data DATA1-OUT output from the first buffer 14 and outputs the data DATA1-OUT to the host through the host interface 13.

The second output selection circuit 172 receives the data DATA1-OUT output from the first buffer 14 or the data DATA2-OUT output from the second buffer 15, and outputs the data to the flash memory block 11 through the flash interface 12, in response to a fourth selection signal SEL4.

If the fourth selection signal SEL4 is changed to the first logic level, for example, to the logic "high" state, the second output selection circuit 172 blocks the data DATA1-OUT output from the first buffer 14, receives the data DATA2-OUT output from the second buffer 15 and outputs the data DATA2-OUT to the flash memory block 11 through the flash interface 12. If the fourth selection signal SEL4 is changed to the second logic level, for example, to the logic "low" state, the second output selection circuit 172 blocks the data DATA2-OUT output from the second buffer 15, receives the data DATA1-OUT output from the first buffer 14 and outputs the data DATA1-OUT to the flash memory block 11 through the flash interface 12.

The first through fourth selection signals SEL1 through SEL4 are generated in a predetermined circuit of the flash interface 12 or, they can be generated by a command output from the host or by a combination of the control signals HBUF-CTRL output from the host.

Figure 2:
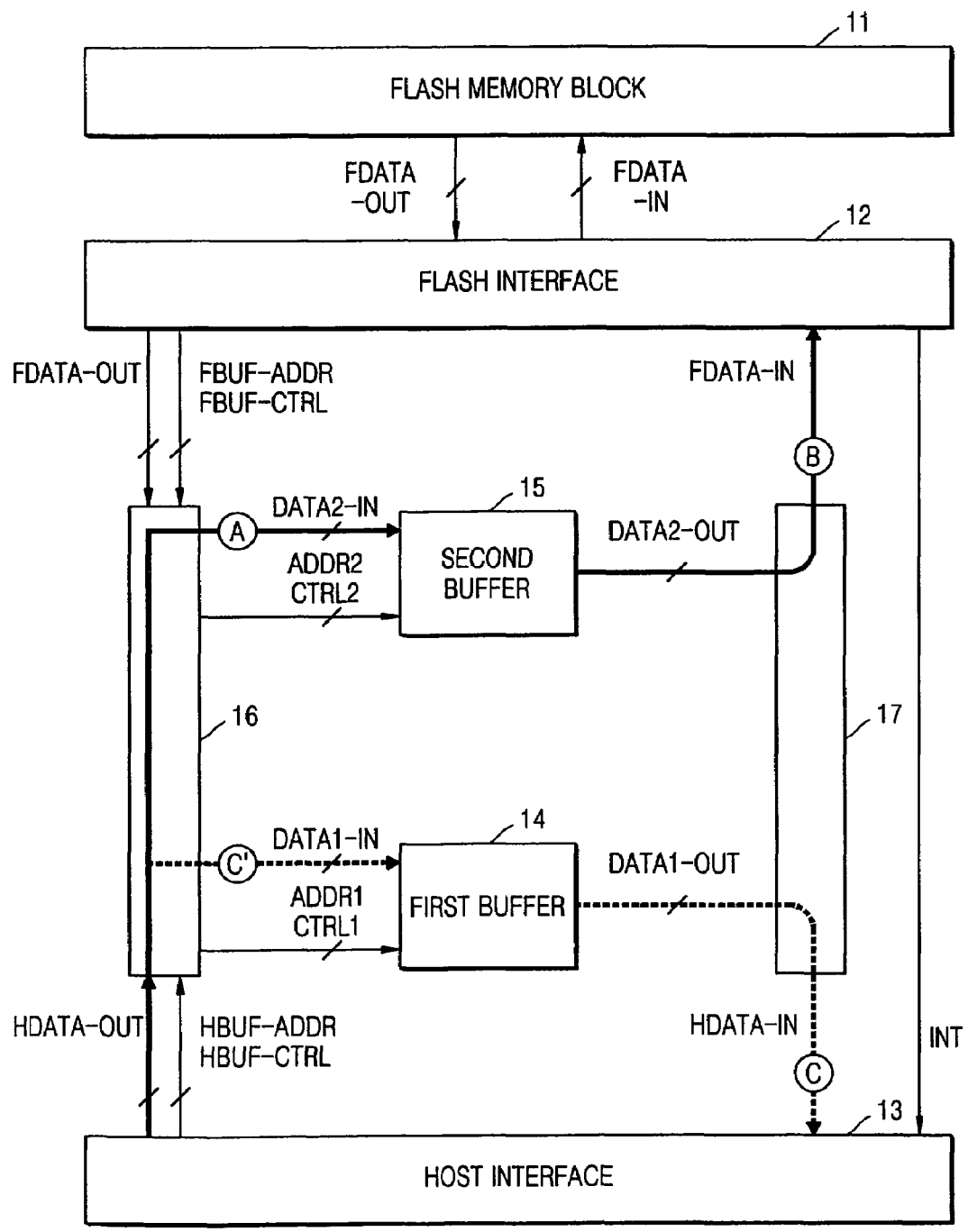
FIG. 2 is a view for explaining an example of a dual buffering method performed by the dual buffer memory system of FIG. 1.
Figure 3:
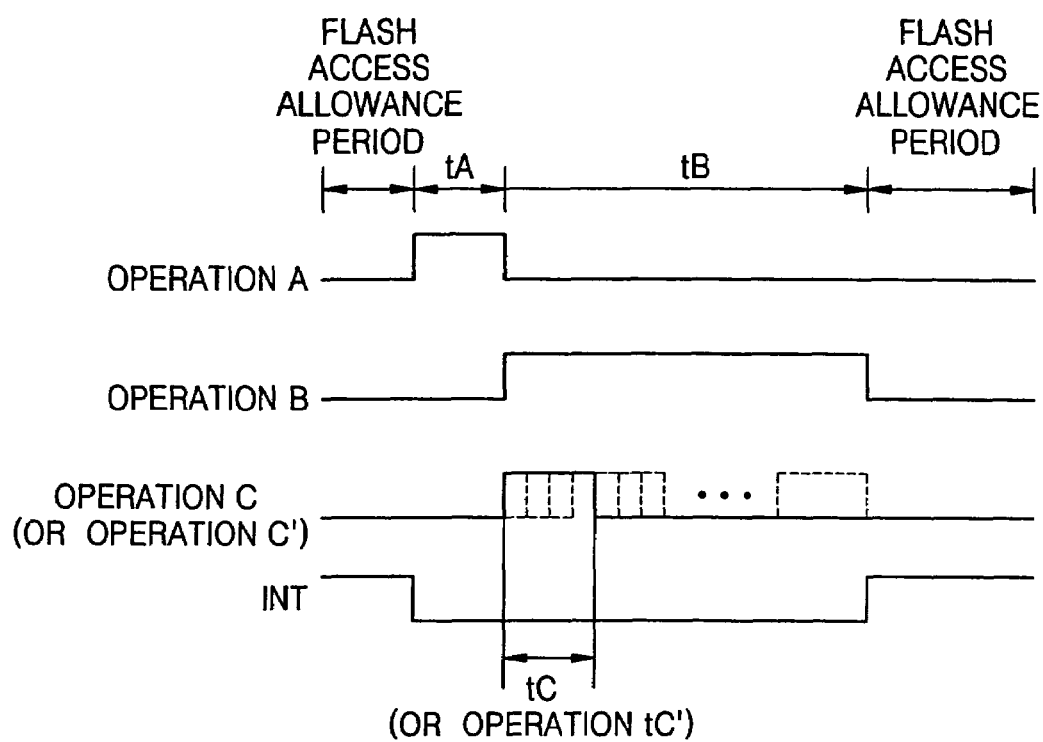
FIG. 3 is a timing chart of the dual buffering method illustrated in FIG. 2.

FIG. 2 is a block diagram for explaining an example of a dual buffering method performed by the dual buffer memory system of FIG. 1, and FIG. 3 is a timing chart of the dual buffering method illustrated in FIG. 2.

Referring to FIG. 2, to write data provided from an external host into the flash memory block 11, while the flash interface 12 occupies one of the first buffer 14 and the second buffer 15, for example, the second buffer 15, the host interface 13 occupies and accesses the other buffer, for example, the first buffer 14, so that the host interface 13 performs a read operation.

In other words, as shown in the timing diagram of FIG. 3, while data stored in one of the first and second buffers 14 and 15, for example, the second buffer 15 is loaded in the flash interface 12 through the second control circuit 17 and is programmed by the flash memory block 12 (operation B), simultaneously, data stored in the other one of the first and second buffers, for example, the first buffer 14, is read and output to the host interface 13 through the second control circuit 17 (operation C).

Before the operation B, data supplied from the host is loaded in the second buffer 15 through the host interface 13 and the first control circuit 16 (operation A). Before the operation C, data read from the flash memory block 11 is loaded in the first buffer 14 through the flash interface 12 and the first control circuit 16.

Meanwhile, in the memory system according to embodiments of the invention, since dual buffering can be performed bi-directionally, an operation C' in which data supplied from the host is loaded in the first buffer 14 through the host interface 13 and the first control circuit 16, may be performed instead of the operation C.

In the timing diagram of FIG. 3, tA represents a time period in which the operation A is performed, tB represents a time period in which the operation B is performed, tC represents a time period in which the operation C is performed, and tC' represents a time period in which the operation C' is performed. INT is generated by the flash interface 12 and is a flag signal indicating whether or not the flash memory block 11 interacts with the first or second buffer 14 or 15.

If the flash memory block 11 interacts with the first or second buffer 14 or 15, that is, if the flash memory block 11 accesses the first or second buffer 15, the flag signal INT is changed to the logic "low" state. On the contrary, if the flash memory block 11 does not interact with the first or second buffer 14 or 15, that is, if the flash memory block 11 does not access the first or second buffer 15, the flag signal INT is changed to the logic "high" state. Accordingly, while the flag signal INT is in the logic "high" state, a buffer occupied by the flash memory block 11 can be again occupied by the host or the flash memory block 11.

Figure 4:
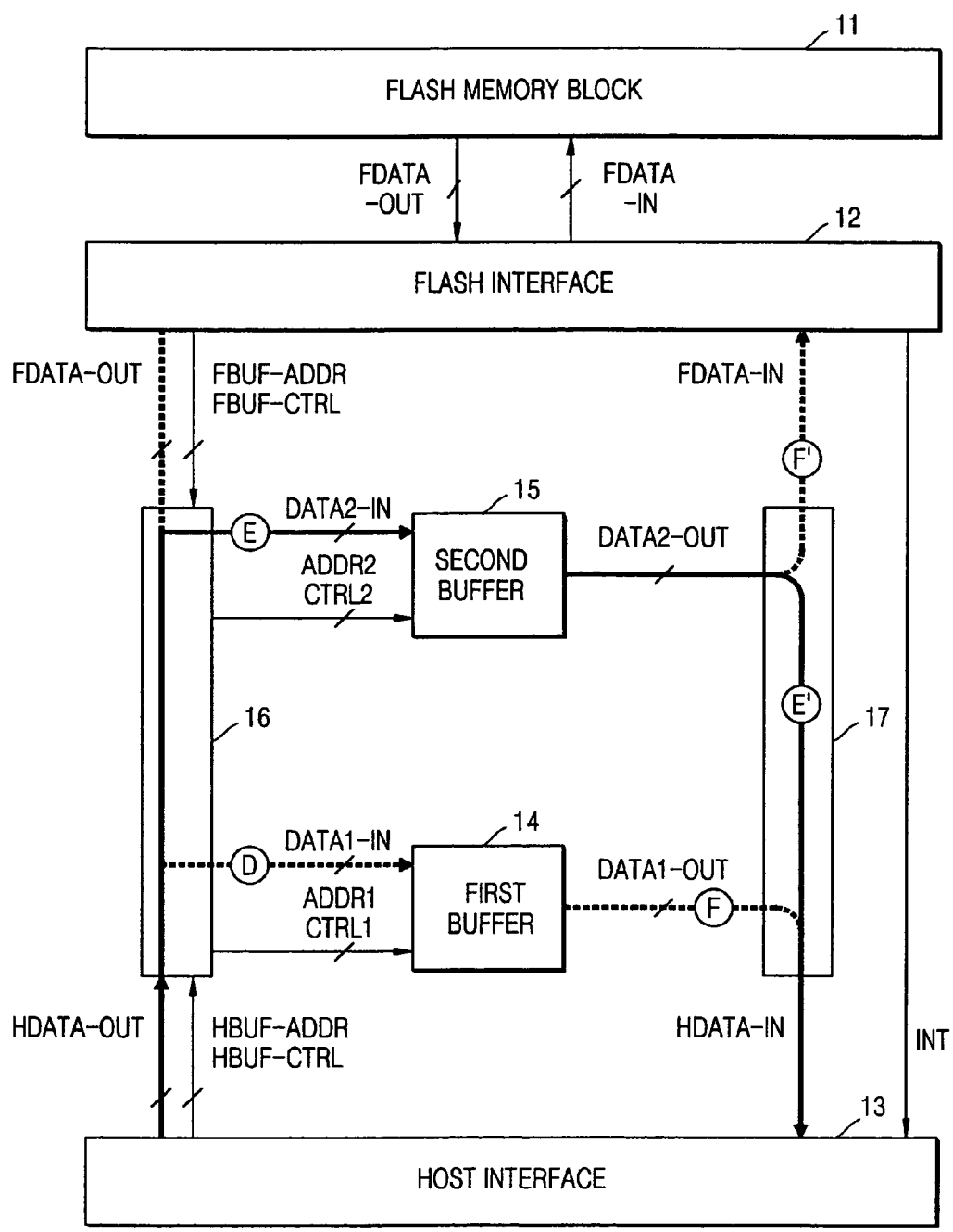
FIG. 4 is a block diagram illustrating another example of a dual buffering method performed by the dual buffer memory system of FIG. 1.
Figure 5:
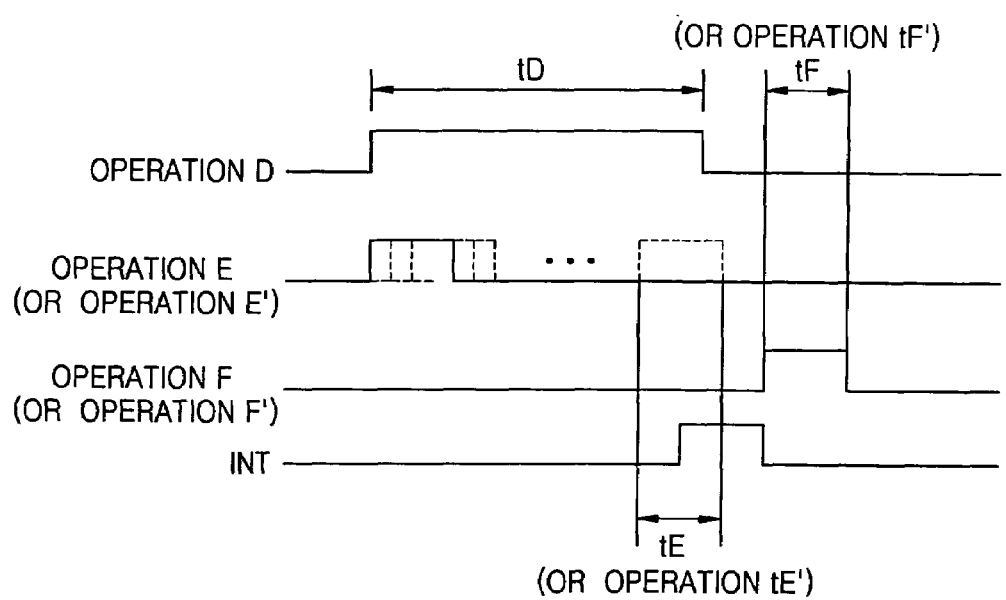
FIG. 5 is a timing diagram of the dual buffering method illustrated in FIG. 4.

FIG. 4 is a view for explaining another example of a dual buffering method performed by the dual buffer memory system of FIG. 1, and FIG. 5 is a timing diagram of the dual buffering method illustrated in FIG. 4.

Referring to FIG. 4, to read data from the flash memory block 11, while the flash interface 12 occupies one of the first and second buffers 14 and 15, for example, the first buffer 14, the host interface 13 loads data in the other one of the first and second buffers 14 and 15, for example, in the second buffer 15, or occupies and accesses the second buffer 15 to read data from the second buffer 15.

In other words, as shown in the timing diagram of FIG. 5, while data stored in the flash memory block 11 is read and loaded in one of the first and second buffers 14 and 15, for example, in the first buffer 14, through the first control circuit 16 (operation D), simultaneously data supplied from the host is loaded in the other one of the first and second buffers 14 and 15, for example, in the second buffer 15, through the first control circuit 16 (operation E).

After operations D and E, data stored in the first buffer 14 is read and output to the host through the second control circuit 17 and the host interface 13 (operation F), and simultaneously data stored in the second buffer 15 is loaded into the flash interface 12 through the second control circuit 17 and programmed by the flash memory block 11 (operation F').

Meanwhile, in the memory system according to embodiments of the invention, since dual buffering can be performed bi-directionally, an operation E' in which data stored in the second buffer 15 is read and output to the host interface 13 through the second control circuit 17, may be performed instead of the operation E.

In the timing diagram of FIG. 5, tD represents a time period in which the operation D is performed, tE represents a time period in which the operation E is performed, tE' represents a time period in which the operation E' is performed, tF represents a time period in which the operation F is performed, and tF' represents a time period in which the operation F' is performed.

Figure 6:
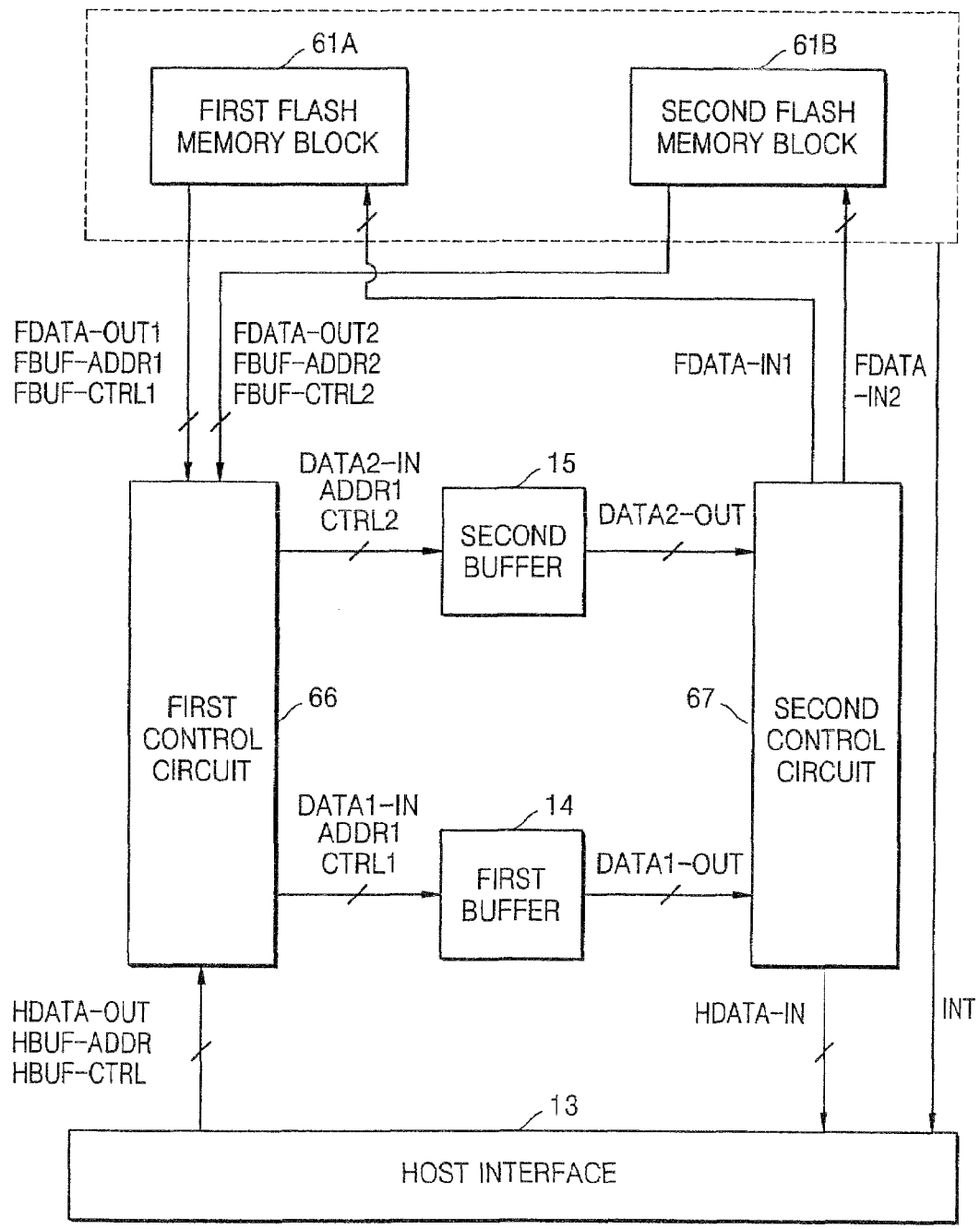
FIG. 6 is a block diagram of a dual buffer memory system according to another embodiment of the invention.

FIG. 6 is a block diagram of a dual buffer memory system according to another embodiment of the present invention.

Referring to FIG. 6, the dual buffer memory system according to the second embodiment of the present invention includes a first flash memory block 61A, a second flash memory block 61B, a host interface 13, a first buffer 14, a second buffer 15, a first control circuit 66, and a second control circuit 67. Here, a flash interface is not shown for the convenience of description.

The first control circuit 66 receives data FDATA-OUT1, an address FBUF-ADDR and control signals FBUF-CTRL1 from the first flash memory block 61A or receives data FDATA-OUT2, an address FBUF-ADDR2, and control signals FBUF-CTRL2 from the second flash memory block 61B. The second control circuit 67 receives data DATA1-OUT output from the first buffer 14 or data DATA2-OUT output from the second buffer 15, and outputs the received data as write data FDATA-IN1 to the first flash memory block 61A or as write data FDATA-IN2 to the second flash memory block 61B.

As such, the dual buffer memory system according to this embodiment is similar to the dual buffer memory system according to the embodiment previously described, except that two flash memory blocks 61A and 61B are further included and the structures and operations of the first and second control circuits 66 and 67 are similar to those of the first embodiment. Therefore, the detailed description for the second embodiment is omitted.

Figure 7:
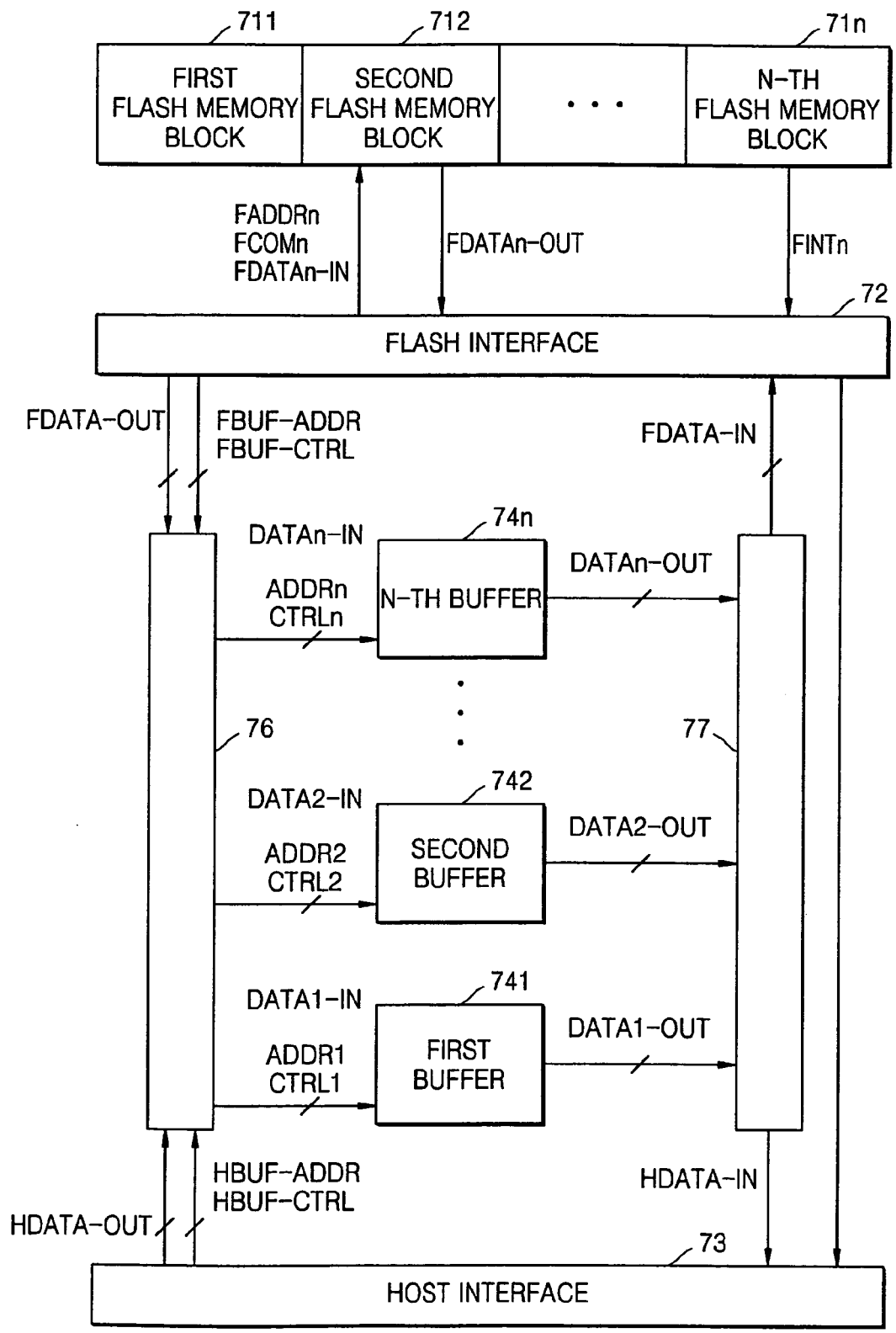
FIG. 7 is a block diagram of a dual buffer memory system according to another embodiment of the invention.

FIG. 7 is a block diagram of a dual buffer memory system according to another embodiment of the invention. Referring to FIG. 7, the dual buffer memory system includes flash memory blocks 711-71n, a flash interface 72, a host interface 73, buffers 741-74n, a first control circuit 76, and a second control circuit 77, wherein n is an integer.

The dual buffer memory system of FIG. 7 is similar to the dual buffer memory system described above with reference to FIGS. 1-3, except that several flash memory blocks 711-71n and several buffers 741-74n are further included. Also, the structures and operations of the first and second control circuits 76 and 77 are similar to those of the first embodiment. That is, like the first and second embodiments, while the flash interface 72 occupies any of the buffers 741-74n, other buffers 741-74n can be occupied by the host interface 73.

Meanwhile, since the dual buffer memory system illustrated in FIG. 7 includes flash memory blocks 711-71n and buffers 741-74n, the dual buffer memory system can perform a multi buffering operation. For example, while data FDATAn-IN is programmed into the memory cells of the first flash memory block 711 after the first flash memory block 711 receives an address FADDRn, a program command FCOMn, and the data FDATAn-IN from the flash interface 72, the second flash memory block 712 can receive a different command from the flash interface 72, and perform a programming operation or erase operation.

Likewise, while the memory cells of the first flash memory block 711 are erased after the first flash memory block 711 receives an address FADDRn and an erase command FCOMn from the flash interface 72, the second flash memory block 712 can receive a different command from the flash interface 72 and perform a programming operation or erase operation.

Figure 8:
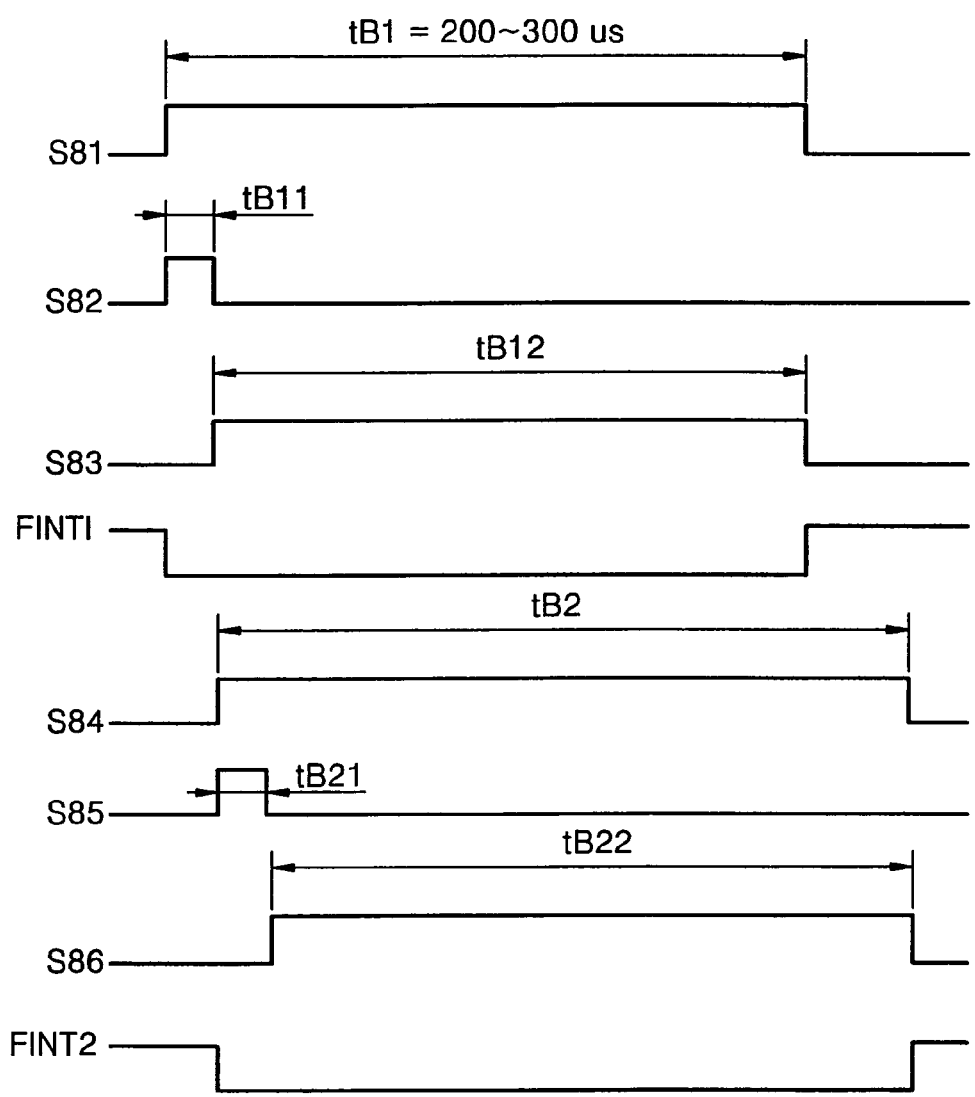
FIG. 8 is a timing diagram illustrating a programming operation in a second flash memory block while a first flash memory block performs a programming operation in the memory system of FIG. 7.

FIG. 8 is a timing diagram illustrating an example operation of the second flash memory block 712 performing a programming operation while the first flash memory block 711 performs a programming operation in the memory system of FIG. 7. Here, tB1 of a signal S81 represents a total programming operation period of the first flash memory 711. tB11 of a signal S82 represents a time period in which an address FADDRn, a program command FCOMn, and data FDATAn-IN are transmitted from the flash interface 72 to the first flash memory block 711. tB12 of a signal S83 represents a time period in which received data is programmed into memory cells of the first flash memory block 711. FINT1 represents a flag signal which is activated in a logic "low" during the total programming operation period tB11 of the first flash memory block 711. tB2 of a signal S84 represents a total programming operation period of the second flash memory block 712. tB21 of a signal S85 represents a time period in which an address FADDRn, a program command FCOMn, and data FDATAn-IN are transmitted from the flash interface 72 to the second flash memory block 712. tB22 of a signal S86 represents a time period during which received data is programmed into memory cells of the second flash memory block 712. FINT2 represents a flag signal which is activated in a logic "low" during a total programming operation period of the second flash memory block 712.

Figure 9:
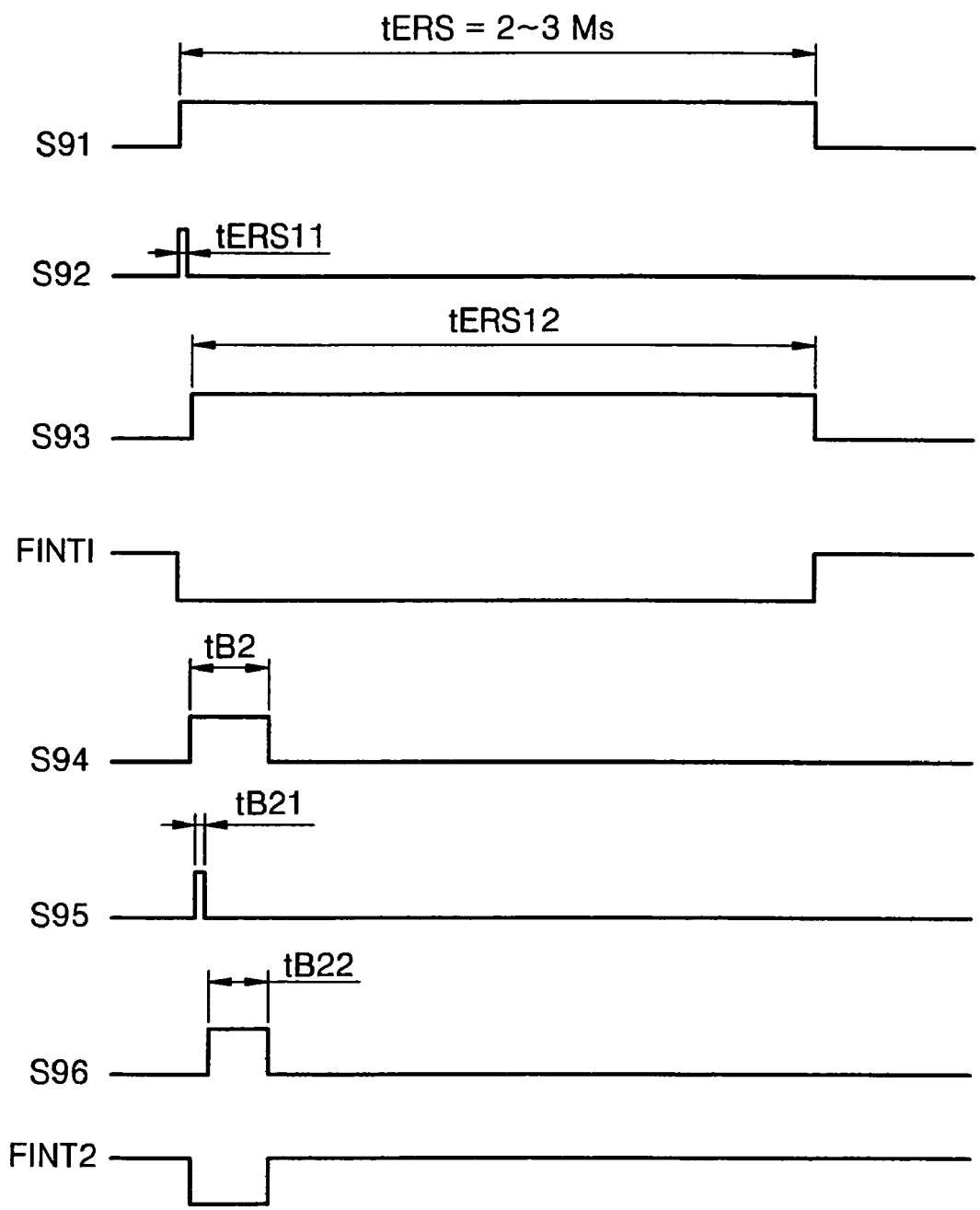
FIG. 9 is a timing diagram illustrating a programming operation in the second flash memory block while the first flash memory block performs an erase operation in the memory system of FIG. 7.

FIG. 9 is a timing diagram illustrating an example operation of the second flash memory block 712 performing a programming operation while the first flash memory block 711 performs an erase operation in the memory system of FIG. 7. Here, tERS of a signal S91 represents a total erase operation period of the first flash memory block 711. tERS11 of a signal S92 represents a time period in which an address FADDRn and an erase command FCOMn are transmitted from the flash interface 72 to the first flash memory block 711. tERS12 of a signal S93 represents a time period during which an erase operation is performed in memory cells of the first flash memory block 711. The flag signal FINT1 is activated in a logic "low" during a total erase operation period of the first flash memory block 711.

tB2 of a signal S94 represents a total programming operation period of the second flash memory block 712. tB21 of a signal S95 represents a time period in which an address FADDRn, a program command FCOMn, and data FDATAn-IN are transmitted from the flash interface 72 to the second flash memory block 712. tB22 of a signal S96 represents a time period during which received data is programmed into memory cells of the second flash memory block 712. The flag signal FINT2 is activated in a logic "low" during a total programming operation period of the second flash memory block 712.

Figure 10:
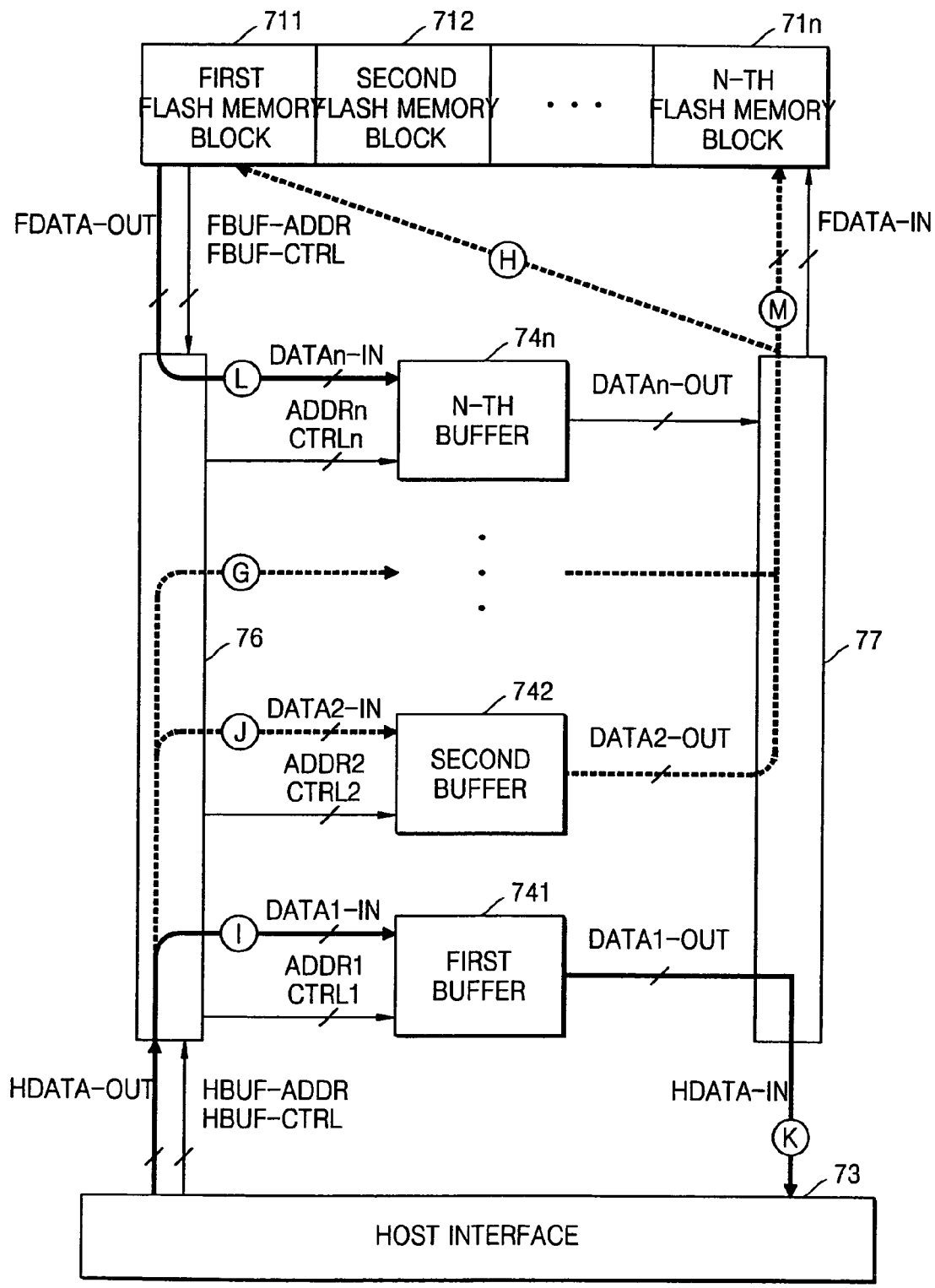
FIG. 10 is a block diagram for explaining an example of a dual buffering method performed by the memory system of FIG. 7.
Figure 11:
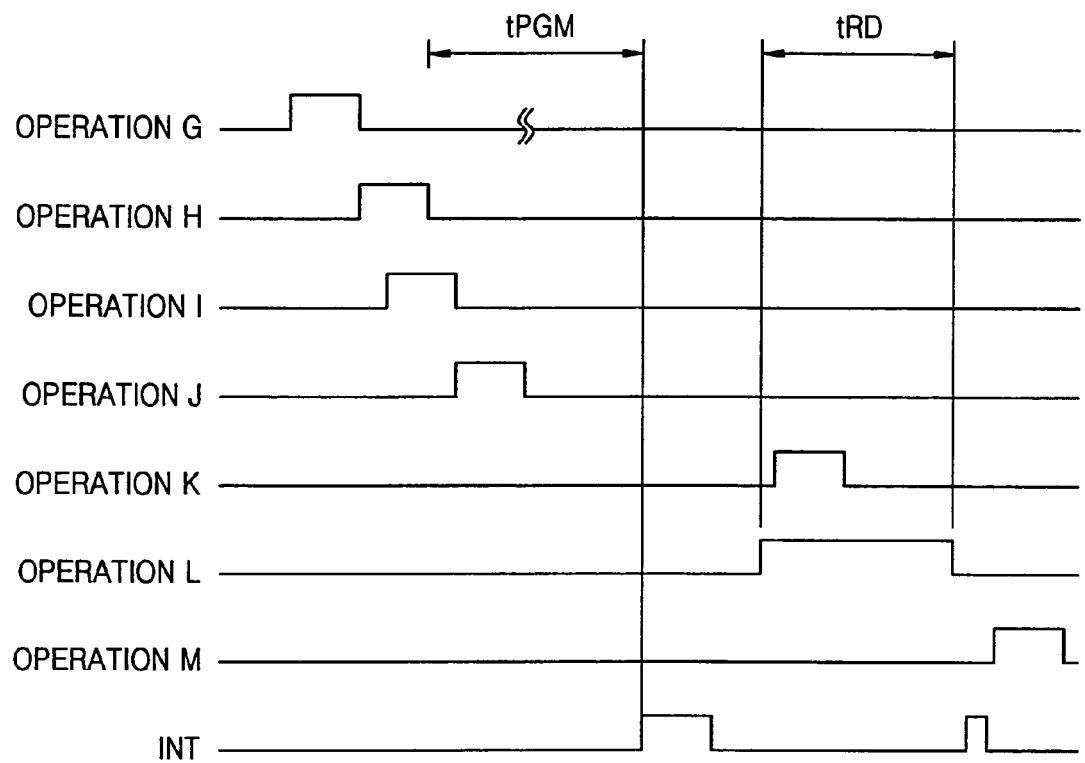
FIG. 11 is a timing diagram of the dual buffering method shown in FIG. 10.

FIG. 10 is a block diagram illustrating an example of a dual buffering method performed by the memory system of FIG. 7, and FIG. 11 is a timing diagram of the dual buffering method illustrated in FIG. 10. Here, a flash interface is not shown for the convenience of description.

Referring to FIG. 10, an example of a dual buffering method performed by a memory system according to embodiments of the invention is described. First, data supplied from the host is loaded into a (n−1)-th buffer (not shown) through the host interface 73 and the first control circuit 76 (operation G), and then the data stored in the (n−1)-th buffer is loaded into the first flash memory block 711 through the second control circuit 77 and programmed by the first flash memory block 711 (operation H).

During this programming operation, the host or a predetermined flash memory block not being operated can occupy any buffer except for the (n−1)-th buffer. Accordingly, while operation H is performed, data supplied from the host is loaded into the first buffer 741 through the host interface 73, and the first control circuit 76 (operation I) and different data supplied from the host can be loaded into the second buffer 742 through the host interface 73 and the first control circuit 76 (operation J).

If data is loaded sequentially in all buffers in such a manner, the flag signal INT is changed to the logic "high" state, and accordingly the flash memory blocks can again access the buffers. That is, data stored in the first buffer 741 is read and output to the host interface 73 through the second control circuit 77 (operation K), and simultaneously data read from the first flash memory block 711 is loaded in an n-th buffer 74n through the first control circuit 76 (operation L). Then, data stored in the second buffer 742 is loaded in the n-th flash memory block 71n through the second control circuit 77 and programmed by the n-th flash memory block 71n (operation M). In the timing diagram of FIG. 11, tPGM represents a programming time and tRD represents a read time.

Of course, the above description of embodiments of the invention can be practiced in various ways without deviating from the inventive scope of the invention. What follows are descriptions of particular, non-limiting example embodiments.

According to an embodiment of the invention, a memory system includes: a flash memory block, a flash interface, a host interface, a first buffer, a second buffer, a first control circuit, and a second control circuit.

The flash memory block includes flash memory cells to store data. The flash interface performs interfacing with the flash memory block, and the host interface performs interfacing with a host. The first and second buffers temporarily store data read from the flash memory block or data supplied from the host.

The first control circuit selects a first or a second buffer, receives data read from the flash memory block through the flash interface or receives input data applied from the host through the host interface, and outputs the received data to the selected buffer. The second control circuit receives data output from the first buffer or the second buffer, and outputs the received data to the flash memory block through the flash interface or to the host through the host interface.

The flash interface generates a flag signal indicating whether the flash memory block interacts with the first or second buffer and outputs the flag signal to the host through the host interface.

The first control circuit preferably includes a first input selection circuit and a second input selection circuit. The first input selection circuit outputs read data, a first address, and first control signals received from the flash interface, or input data, a second address, and second control signals received from the host interface to the first buffer, in response to a first selection signal.

The second input selection circuit outputs the read data, the first address, and the first control signals received from the flash interface, or the input data, the second address, and the second control signals received from the host interface to the second buffer, in response to a second selection signal.

When the host and the flash memory block try to occupy the first buffer at the same time, the first input selection circuit blocks data, addresses, and control signals received from the one with a lower priority among the host and the flash memory block. Also, when the host and the flash memory block try to occupy the second buffer at the same time, the second input selection circuit blocks data, addresses, and control signals received from the unit with a lower priority among the host and the flash memory block.

The second control circuit preferably includes a first output selection circuit and a second output selection circuit. The first output selection circuit receives data output from the first buffer or the second buffer and outputs the received data to the host through the host interface, in response to a first selection signal. The second output selection circuit receives data output from the first buffer or the second buffer and outputs the received data to the flash memory block through the flash interface, in response to a second selection signal.

According to another embodiment of the invention, a method of controlling a memory system includes: loading data stored in the first or second buffers in the flash interface and programming the loaded data in the flash memory block; and reading data stored in the other one of the first and second buffers and outputting the read data to the host through the host interface, wherein the loading and programming the data is carried out at the same time as the outputting of the data to the host.

According to another embodiment of the invention a method of controlling a memory system includes: reading data stored in the flash memory block in the flash interface and loading the read data in the first or second buffers through the flash interface; and loading data supplied from the host in the other one of the first and second buffers through the host interface, wherein the loading of the data in the one of the first and second buffers is carried out at the same time as the loading of the data in the other one of the first and second buffers.

According to another embodiment of the invention a method of controlling a memory system includes: outputting either read data, a first address, and first control signals received from the flash interface, or input data, a second address and second control signals received from the host interface to the first buffer; outputting either the read data, the first address, and the first control signals received from the flash interface, or the input data, the second address, and the second control signals received from the host interface to the second buffer; receiving data output from the first buffer or the second buffer and outputting the received data to the host through the host interface; and receiving data output from the first buffer or the second buffer and outputting the received data to the flash memory block through the flash interface.

The outputting to the flash memory block is carried out at the same time as the outputting to the host. Also, the outputting to the first buffer is carried out at the same time as the outputting to the second buffer.

The outputting to the first buffer includes: blocking the read data, the first address, and the first control signals received from the flash interface when the host and the flash memory block try to occupy the first buffer at the same time and the flash memory block has a priority lower than the host, and instead outputting the input data, the second address, and the second control signals received from the host interface to the first buffer; blocking the input data, the second address, and the second control signals received from the host interface when the host and the flash memory block try to occupy the first buffer at the same time and the host has a priority lower than the flash memory block, and instead outputting the read data, the first address, and the first control signals received from the flash interface to the first buffer.

The outputting to the second buffer can include: blocking the read data, the first address, and the first control signals received from the flash interface when the host and the flash memory block try to occupy the second buffer at the same time and the flash memory block has a priority lower than the host, and instead outputting the input data, the second address, and the second control signals received from the host interface to the second buffer; and blocking the input data, the second address, and the second control signals received from the host interface when the host and the flash memory block try to occupy the second buffer at the same time and the host has a priority lower than the flash memory block, and instead outputting the read data, the first address, and the first control signals received from the flash interface to the second buffer.

As described above, the memory system according to embodiments of the invention uses a dual buffering scheme in which one buffer interacts with a flash memory and simultaneously the other buffer interacts with a host. Therefore, it is possible to reduce the data transmission time between the flash memory and the host, thereby improving system performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory system comprising: at least a flash memory block structured to store data; a flash interface structured to interface with the flash memory block; a host interface structured to interface with a host; a first buffer structured to temporarily store data read from the flash memory block or data supplied from the host; a second buffer structured to temporarily store data read from the flash memory block or data supplied from the host; a first control circuit structured to receive data read from the flash memory block, a first address, and first control signals through the flash interface or receive input data, a second address, and second control signals applied from the host through the host interface, to select one of the first and second buffers, and to output either the read data, the first address, and the first control signals or the input data, the second address, and the second control signals to the selected buffer; and a second control circuit structured to receive data output from the first buffer or the second buffer, and output the received data to the flash memory block through the flash interface or to the host through the host interface, wherein, while data stored in one of the first and second buffers is loaded in the flash interface through the second control circuit, simultaneously, data stored in the other one of the first and second buffers is output to the host interface through the second control circuit; wherein the first control circuit comprises: a first input selection circuit structured to output read data, a first address, and first control signals received from the flash interface, or to input data, a second address, and second control signals received from the host interface to the first buffer, in response to a first selection signal; and a second input selection circuit structured to output the read data, the first address, and the first control signals received from the flash interface, or the input data, the second address, and the second control signals received from the host interface to the second buffer, in response to a second selection signal; wherein the second control circuit comprises: a first output selection circuit structured to receive data output from the first buffer or the second buffer and output the received data to the host through the host interface, in response to a first selection signal; and a second output selection circuit structured to receive data output from the first buffer or the second buffer and output the received data to the flash memory block through the flash interface, in response to a second selection signal.

2. The memory system of claim 1, wherein the flash interface generates a flag signal indicating whether the flash memory block interacts with the first or second buffer, and outputs the flag signal to the host through the host interface.

3. The memory system of claim 1, wherein when the host and the flash memory block try to occupy the first buffer at the same time, the first input selection circuit blocks data, addresses, and control signals received from one with a lower priority between the host and the flash memory block.

4. The memory system of claim 1, wherein when the host and the flash memory block try to occupy the second buffer at the same time, the second input selection circuit blocks data, addresses, and control signals received from one with a lower priority between the host and the flash memory block.

5. The memory system of claim 1, wherein, while data stored in one of the first and second buffers is loaded in the flash interface through the second control circuit and programmed by the flash memory block, simultaneously, data stored in the other one of the first and second buffers is read and output to the host interface through the second control circuit.

6. The memory system of claim 1, wherein, while data stored in the flash memory block is read and loaded in one of the first and second buffers through the first control circuit, simultaneously, data supplied from the host is loaded in the other one of the first and second buffers.

7. The memory system of claim 1, wherein the first and second buffers are random access memories.

8. The memory system of claim 1, wherein the flash memory block, the flash interface, the host interface, the first buffer, the second buffer, the first control circuit and the second control circuit are integrated in one chip.

9. A method of controlling a memory system, the memory system including at least a flash memory block to store data, a flash interface to interface with the flash memory block, a host interface to interface with a host, and first and second buffers to temporarily store data read from the flash memory block and data supplied from the host, the method comprising: outputting either read data, a first address, and first control signals received from the flash interface, or input data, a second address, and second control signals received from the host interface to the first buffer; outputting either the read data, the first address, and the first control signals received from the flash interface, or the input data, the second address, and the second control signals received from the host interface to the second buffer; receiving data output from the first buffer or the second buffer and outputting the received data to the host through the host interface; and receiving data output from the first buffer or the second buffer and outputting the received data to the flash memory block through the flash interface; wherein the outputting to the first buffer comprises: when the host and the flash memory block try to occupy the first buffer at the same time and the flash memory block has a priority lower than the host, blocking the read data, the first address, and the first control signals received from the flash interface and outputting the input data, the second address, and the second control signals received from the host interface to the first buffer; and when the host and the flash memory block try to occupy the first buffer at the same time and the host has a priority lower than the flash memory block, blocking the input data, the second address, and the second control signals received from the host interface and outputting the read data, the first address, and the first control signals received from the flash interface to the first buffer; wherein the outputting to the second buffer comprises: when the host and the flash memory block try to occupy the second buffer at the same time and the flash memory block has a priority lower than the host, blocking the read data, the first address, and the first control signals received from the flash interface and outputting the input data, the second address, and the second control signals received from the host interface to the second buffer; and when the host and the flash memory block try to occupy the second buffer at the same time and the host has a priority lower than the flash memory block, blocking the input data, the second address, and the second control signals received from the host interface and outputting the read data, the first address, and the first control signals received from the flash interface to the second buffer.

10. The method of claim 9, wherein the flash interface generates a flag signal indicating whether or not the flash memory block interacts with the first or second buffer, and outputs the flag signal to the host through the host interface.

11. The memory system of claim 1:
further comprising a third buffer structured to temporarily store data read from the flash memory block or data supplied from the host;
wherein the first control circuit is structured to select one of the first, second and third buffers, and to output either the read data, the first address, and the first control signals or the input data, the second address, and the second control signals to the selected buffer; and
wherein the second control circuit is structured to receive data output from the first buffer, the second buffer, or the third buffer, and output the received data to the flash memory block through the flash interface or to the host through the host interface;
wherein, while data stored in one of the first, second and third buffers is loaded in the flash interface through the second control circuit, simultaneously, data stored in another one of the first, second and third buffers is output to the host interface through the second control circuit.

12. The method of claim 9, wherein the memory system further includes a third buffer to temporarily store data read from the flash memory block and data supplied from the host; the method further comprising:
outputting either read data, a first address, and first control signals received from the flash interface, or input data, a second address, and second control signals received from the host interface to the third buffer;
receiving data output from the first buffer, the second buffer or the third buffer and outputting the received data to the host through the host interface; and
receiving data output from the first buffer, the second buffer or the third buffer and outputting the received data to the flash memory block through the flash interface;
wherein the outputting to the flash memory block is carried out at the same time as the outputting to the host interface, or the receiving through the flash interface is carried out at the same time as the receiving through the host interface.

* * * * *